(12) United States Patent
Faris

(10) Patent No.: US 8,105,434 B2
(45) Date of Patent: Jan. 31, 2012

(54) SI RIBBON, SIO2 RIBBON AND ULTRA PURE RIBBONS OF OTHER SUBSTANCES

(76) Inventor: Sadeg M. Faris, Pleasantville, NY (US)

( * ) Notice: Subject to any disclaimer, the term of this patent is extended or adjusted under 35 U.S.C. 154(b) by 1142 days.

(21) Appl. No.: 11/501,175

(22) Filed: Aug. 7, 2006

(65) Prior Publication Data

US 2007/0190752 A1 Aug. 16, 2007

Related U.S. Application Data

(60) Provisional application No. 60/705,980, filed on Aug. 5, 2005, provisional application No. 60/728,355, filed on Oct. 19, 2005.

(51) Int. Cl.
*C30B 29/04* (2006.01)
(52) U.S. Cl. .................................. 117/2; 117/3; 117/34
(58) Field of Classification Search .................. 117/1, 2, 117/34
See application file for complete search history.

(56) References Cited

U.S. PATENT DOCUMENTS

| 4,193,974 A | 3/1980 | Kotval et al. |
| 2007/0202029 A1 | 8/2007 | Burns et al. |
| 2007/0217988 A1 | 9/2007 | Amendola |

OTHER PUBLICATIONS

Poignon et al, "Mobility of ionic impurities in quartz", Journal de Physique IV, Proceedings (1994) 4 c2, abstract only.*
Dr. Helmut Foll, Semiconductors I, "3.2.2 Silicon for Solar Cells," modified Nov. 17, 2009 at http://www.tf.uni-kiel.de/matwis/amat/semi_en/kap_3/backbone/r3_2_2.html, pp. 1-8.

* cited by examiner

*Primary Examiner* — Bob M Kunemund

(57) ABSTRACT

A method of purifying substances is described herein, particularly suitable for purifying silica and forming it into silicon oxide sheets or ribbons, or silicon sheets or ribbons. The method includes ion sweeping a sheet of a substance containing ionic impurities by providing an ionic driving force and a thermal driving force. Ions are swept to a collectable region of the sheet. A system is also provided for purifying substances including an ion sweeping sub-system for providing an ionic driving force to a sheet or ribbon, and a heating sub-system positioned and configured for heating the sheet or ribbon. Impurities swept to an edge, surface or both are then mechanically or chemically removed.

77 Claims, 14 Drawing Sheets

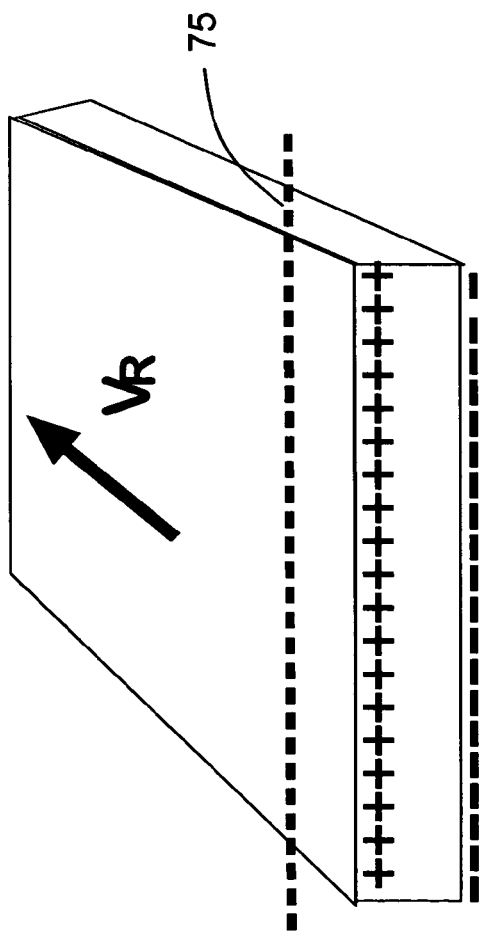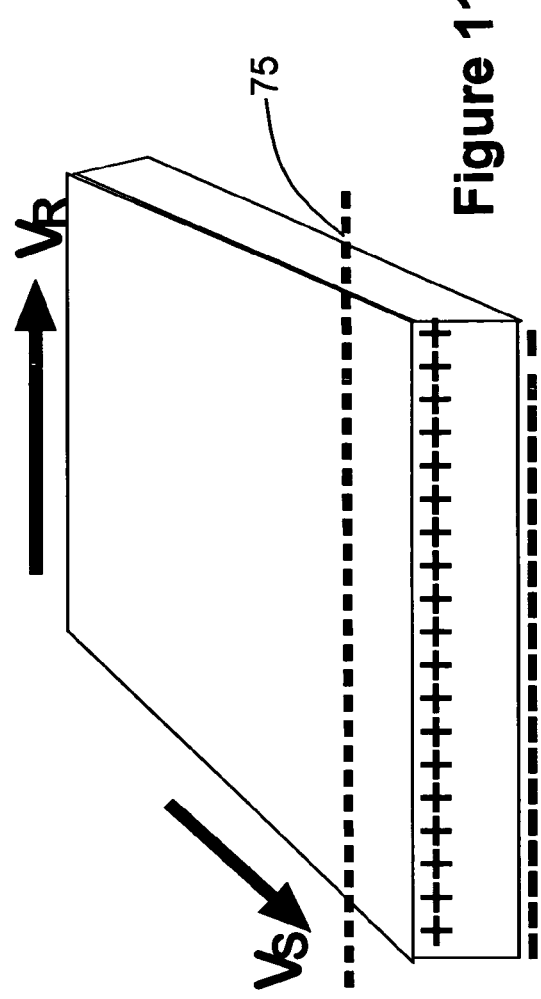

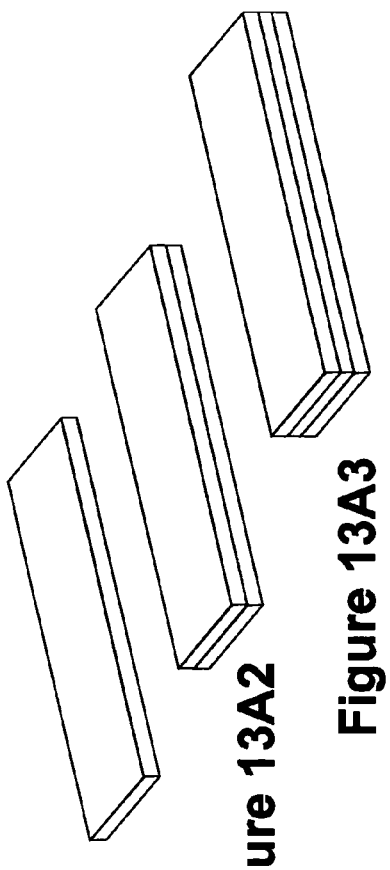
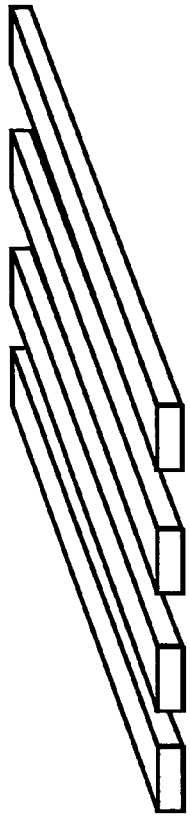
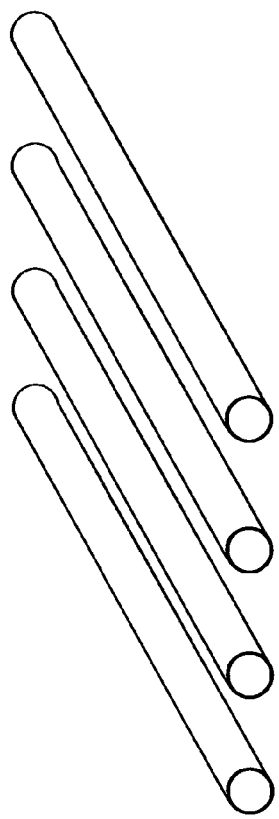
Figure 13A1
Figure 13A2
Figure 13A3
Figure 13B
Figure 13C

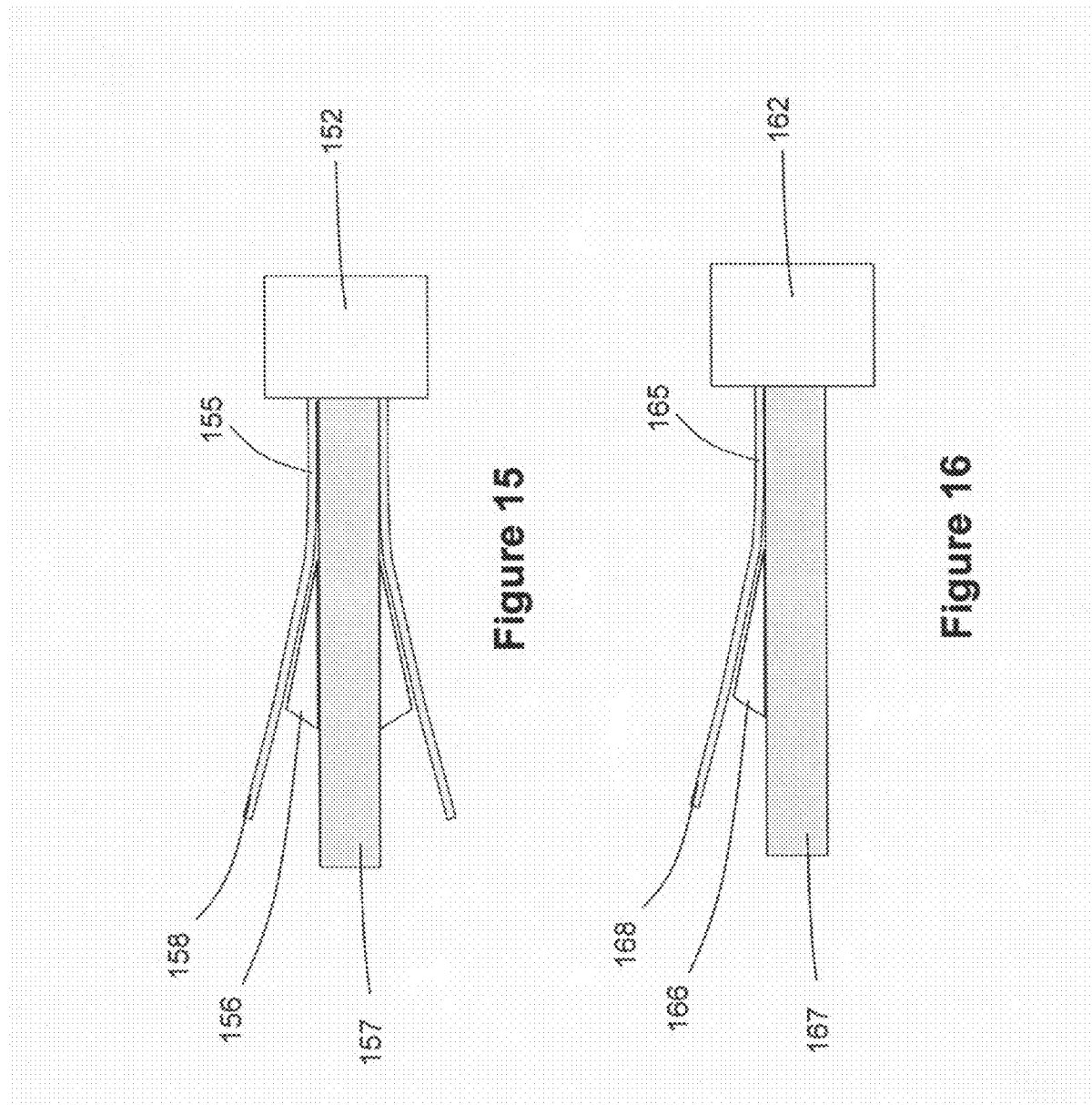

SI RIBBON, SIO2 RIBBON AND ULTRA PURE RIBBONS OF OTHER SUBSTANCES

RELATED APPLICATIONS

This application claims the benefit under 35 U.S.C. §119(e) of U.S. Provisional Application Nos. 60/705,980 filed on Aug. 5, 2005 entitled "Si Ribbon, SiO2 Ribbon and Ultra Pure Ribbons of Other Substances" and 60/728,355 filed on Oct. 19, 2005 entitled "Si Ribbon, SiO2 Ribbon and Ultra Pure Ribbons of Other Substances" all of which are incorporated by reference herein.

BACKGROUND ART

Forming single crystal silicon by various methods is known[1]. In general, to create silicon in a single-crystal state, high-purity silicon must be melted and reformed or solidified very slowly in contact with a single crystal "seed." The silicon adapts to the pattern of the single-crystal seed as it cools and gradually solidifies, for example, into a rod or boule of single-crystal silicon.

[1] http://www.eere.energy.gov/solar/silicon.html; see also, http://www.tf.uni-kiel.de/matwis/amat/semi_en/kap_3/backbone/r3_2_2.html Once typical single-crystal rods are produced, by either the Cz or FZ method described herein, they must be sliced or sawn to form thin wafers. This sawing process, however, wastes as much as 20% of the valuable silicon as dust, known as "kerf." Further, the Cz and FZ processes are complex and expensive.

In the Czochralski process, a seed crystal is dipped into a crucible of molten silicon and withdrawn slowly. As it is withdrawn, a cylindrical single crystal forms as the silicon crystallizes on the seed. However, crystals may be contaminated by the crucible used in growing Czochralski crystals.

The float-zone process produces purer crystals than the Czochralski method, since a crucible is not used. In the float-zone process, a silicon rod is set upon a seed crystal, and lowered through an electromagnetic coil. The coil's magnetic field induces an electric field in the rod, heating and melting the interface between the rod and the seed. Single-crystal silicon forms at the interface, growing up the cylinder as the coils are slowly raised.

Another group of crystal-producing processes are referred to as "ribbon growth" processed. These single crystals may cost less than other processes, since they form the silicon directly into thin, usable wafers of single-crystal silicon. These methods involve forming thin crystaline sheets directly, thus avoiding the slicing step required of cylindrical rods.

One "ribbon growth" technique is known as edge-defined film-fed growth. In this process, two crystal seeds are grown and a sheet of material is captured between them as they are pulled from a source of molten silicon. A frame holds a thin sheet of material when drawn from a melt. This technique does not waste much material. However, a key limitation is that the purity of the material formed from conventional silicon ribbon growth processed is not as high as silicon formed by the Cz and FZ methods. This is not acceptable for many applications. Further, it reduces the efficiency in applications where it is acceptable, such as certain photovoltaic cell processes.

One example of a process for forming silicon ribbon is disclosed in U.S. Pat. No. 4193,974: Process for producing refined metallurgical silicon ribbon.

Another well known process of the fabrication of low loss optical fibers for wide bandwidth communications, which have become ubiquitous. Their manufacture relies on having ultra-pure glass pre-forms (in the form of cylindrical rods) made of about 94% $SiO_2$ and 6% $GeO_2$. These are usually made from oxidizing $SiCl_4$ and $GeO_2$ which are know to have ultra-high purity, with impurity levels in the sub 1 part per billion. These pure glass pre-forms are then heated to an appropriate state of softness to facilitate drawing fibers having diameters in the range of 1-1000 microns and lengths of tens of kilometers.

Conventional attempts to produce pure optical fibers (e.g., sub 1 part per billion impurities) follow the following general steps as illustrated in FIGS. 1A-1B.

Step 1: Providing silica or quartz powder with purity in the range of 97%-99.9%. The heating the powder to a high temperature near or above the melting temperature of ~1870° C. in the presence of a reducing agent like coke or other carbon. The $SiO_2$ reduces to Si and $CO_2$. The silicon produced in this manner is called Metallurgical Grade Silicon or MGS.

Step 2: The MGS is reacted with HCl and $Cl_2$ to respectively produce $SiCl_4$ and $SiHCl_2$ gases.

Step 3: The $SiCl_4$ and $SiHCl_2$ thus produced are purified by means of fractional distillation process that has been shown to reliably produce purities of sub 1 part per billion. This is step is costly and requires precautions constrained by safety and environmentally considerations due to hazardous toxic waste materials.

Step 4: Providing $GeO_2$ powder with purity in the range of 97%-99.9%. The heating the powder to a high temperature near or above the melting temperature in the presence of a reducing agent like coke or other carbon. The $GeO_2$ reduces to Ge and $CO_2$. The germanium produced in this manner is called Metallurgical Grade germanium or MGG.

Step 5: The MGG is reacted with HCL and $Cl_2$ to respectively produce $GeC_4$ and $GeHCl_2$ gases.

Step 6: The $GeCl_4$ and $GeHCl_2$ thus produced are purified by means of fractional distillation process that has been shown to reliably produce purities of sub 1 part per billion. This is step is costly and requires precautions constrained by safety and environmentally considerations due to hazardous toxic waste materials.

Step 7: The ultra-pure $SiCl_4$ and $GeCl_4$ are oxidized to produce ultra-high purity (sub 1 part per billion) $SiO_2$ $GeCl_2$ soot that is collected on a cylindrical substrate such quartz tubes and becomes the perform from which the glass fibers are drawn. This step also adds to the cost and also is constrained by environmental and safety constraints.

Step 8: The glass soot on the substrate is sintered to produced dense pre-form.

Step 9: The pre-form in an optical fiber manufacturing facility is heated to temperatures about 2000° C. and so that it can be drawn into tens of km long fibers with diameters ranging from 1 micron to 100 microns.

The conventional method described generally above has many steps which are expensive requiring heavy capital investment. This includes costly strategies for safety, environmental protection and disposal of hazardous material. Normally, these factories are designed to produce high volumes to justify the heavy capital investment and produce a final product that is priced advantageously for market acceptance. What also adds to the cost of prior method are strategies for recycling the germanium gases, the helium, and all the Cl based materials and gases released during the various processes.

Another key limitation of conventional methods is the discontinuity of manufacturing steps. This means that not all steps are carried our "under one roof" by one manufacture. The process involves different entities with different expertise. This adds cost due to the storage, transportation and sometimes duplicate infrastructure in different installations to cope with the safety and environmental hazardous materials.

It is highly desirable to seek an alternative method of manufacturing sub 1 part per billion $SiO_2$ that has the following characteristics: 1) Reduces cost by eliminating certain steps. 2) Eliminates the steps that are generally unsafe and are unfriendly to the environment. 3) Scalable from small low volume sized to large sizes. 4) The final product has multi uses instead of merely used for making optical fibers. This leverages the infrastructure to produced more profit. 5) Continuous "under-one-roof" manufacturing.

BRIEF SUMMARY OF THE INVENTION

A method of purifying substances is described herein, particularly suitable for purifying silica and forming it into silicon oxide sheets or ribbons, or silicon sheets or ribbons. The method includes ion sweeping a sheet of a substance containing ionic impurities by providing an ionic driving force and a thermal driving force. Ions are swept to a collectable region of the sheet.

A system is also provided for purifying substances including an ion sweeping sub-system for providing an ionic driving force to a sheet or ribbon, and a heating sub-system positioned and configured for heating the sheet or ribbon. Impurities swept to an edge, surface or both are then mechanically or chemically removed.

It is therefore the object of this invention is to provide a novel method for producing ultra-high purity sub 1 part per billion $SiO_2$ films or ribbons which is scalable, reduces the cost by eliminating several steps that are constrained by environment and safety considerations, and are in the thickness range of sub micron to few microns.

Another object of this invention is to provide a novel method for producing continuous, "under-one-roof", ultra-high purity sub 1 part per billion $SiO_2$ films or ribbons.

Another object of this invention is to provide a novel method for producing continuous, "under-one-roof", optical fibers having ultra-high purity sub 1 part per billion $SiO_2$ and $GeO_2$ and other dopants.

Another object of this invention is to provide a novel method for producing ultra-high purity sub 1 part per billion $SiO_2$ films or ribbons in the thickness range of sub micron to few microns.

Another object of this invention is to produce $SiO_2$ ribbons in the thickness range of few micron to several mm by stacking a plurality of ultra-thin ribbons.

Another object of this invention is to produce pre-forms for fiber optics.

Yet another object of this invention is the teaching of a novel electromagnetic purification method that eliminates many manufacturing steps of conventional processing techniques.

Another object of this invention is the application of this method to produce ultra-pure glasses and oxides of other metals.

These and another objects of the invention will become apparent during the description of the preferred embodiments.

BRIEF DESCRIPTION OF THE FIGURES

The foregoing summary as well as the following detailed description of preferred embodiments of the invention will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings, where:

FIGS. 10-12 show positions of cut lines of various systems described herein;

FIGS. 13A1-13A3 representatively show sheets of material;

FIG. 13B shows the material in the form of sliced strips, e.g., sliced from wider sheets or ribbons;

FIG. 13C shows the material in the form of cylindrical rods, or pre-forms;

FIG. 15 shows an embodiment of a method and system for further purification and

FIG. 16 shows an embodiment of a method and system for deriving a thin layer in conjunction with the embodiments herein.

DETAILED DESCRIPTION OF THE FIGURES

This invention exploits advantageously the fundamental proprieties of the oxide of silicon and other elements in the glass phase. Certain materials appear abundantly in nature, such as silica sands, and are available inexpensively. The melting temperatures, softening temperatures and viscosities of these materials can be lowered by introduction of appropriate amounts of impurities. The purer glass typically results in higher melting temperatures. This property is used as described herein to help purification.

The impurities in the glass are typically ions (OH−; Mg++; N+, Li+, K+, Fe++, Ca++,). The motilities of such ions become high near and above the melting temperature. This property, in conjunction with the small thickness of ribbons, leads to high speed and high through-put production.

When soft, glass materials can be drawn into sheets of varying thicknesses and fibers continuously achieving micron dimensions. In vitrified solid state at ambient temperatures, thin ribbons and fibers can be wound continuously of reels, for example in a cylindrical form factor for easy transport and storage.

Figure 2:
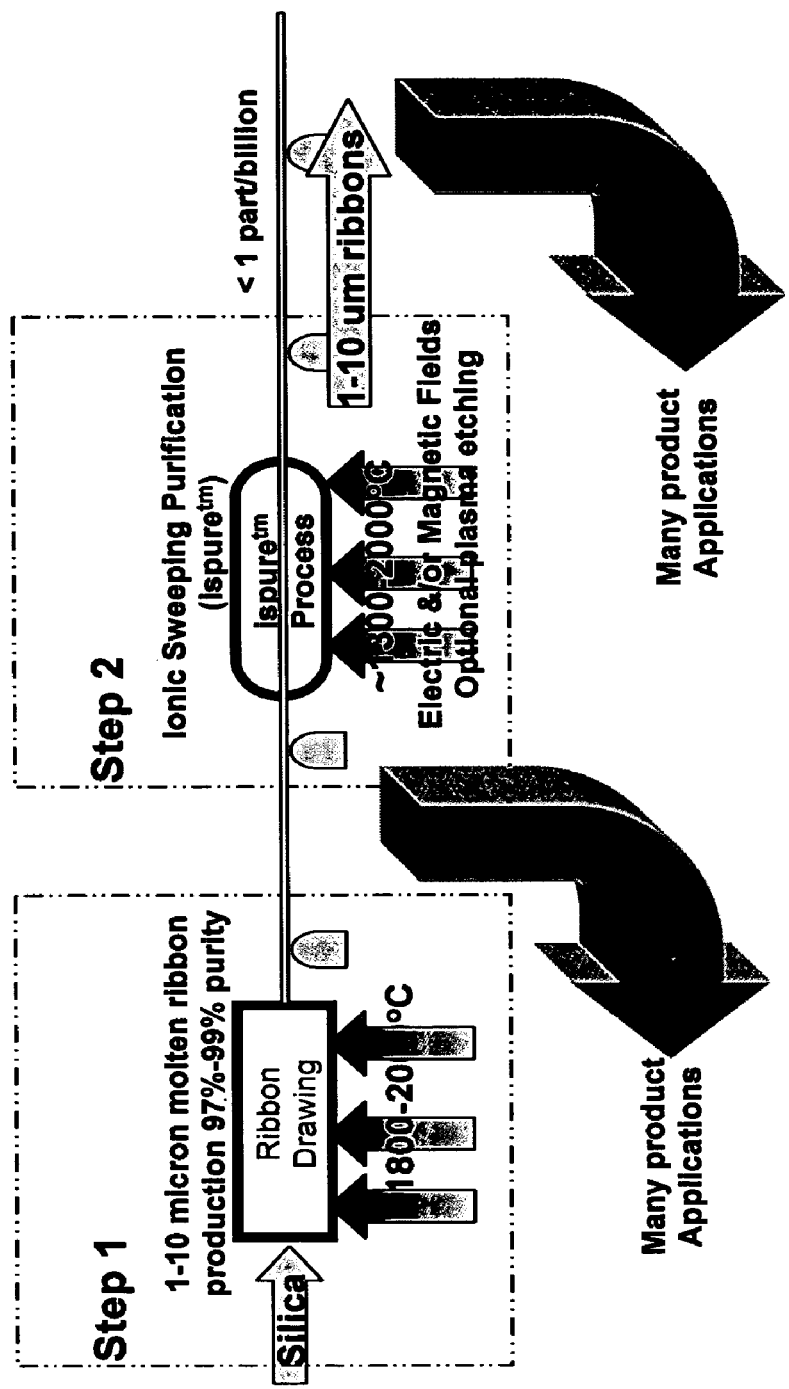
FIG. 2 is a process flow schematic for forming ultra pure ribbons of silicon oxide or other materials.

Referring now to FIG. 2, a process is shown for forming ultra pure ribbon of silicon oxide. This process may be expanded to form ultra-pure ribbons or sheets or other materials as well. Substance to be purified according to certain aspects of the present invention include reducible substances, organic solids, inorganic solids, nitrides, sulfides, oxides, chlorides, carbides, metals or alloys.

Figure 1A:
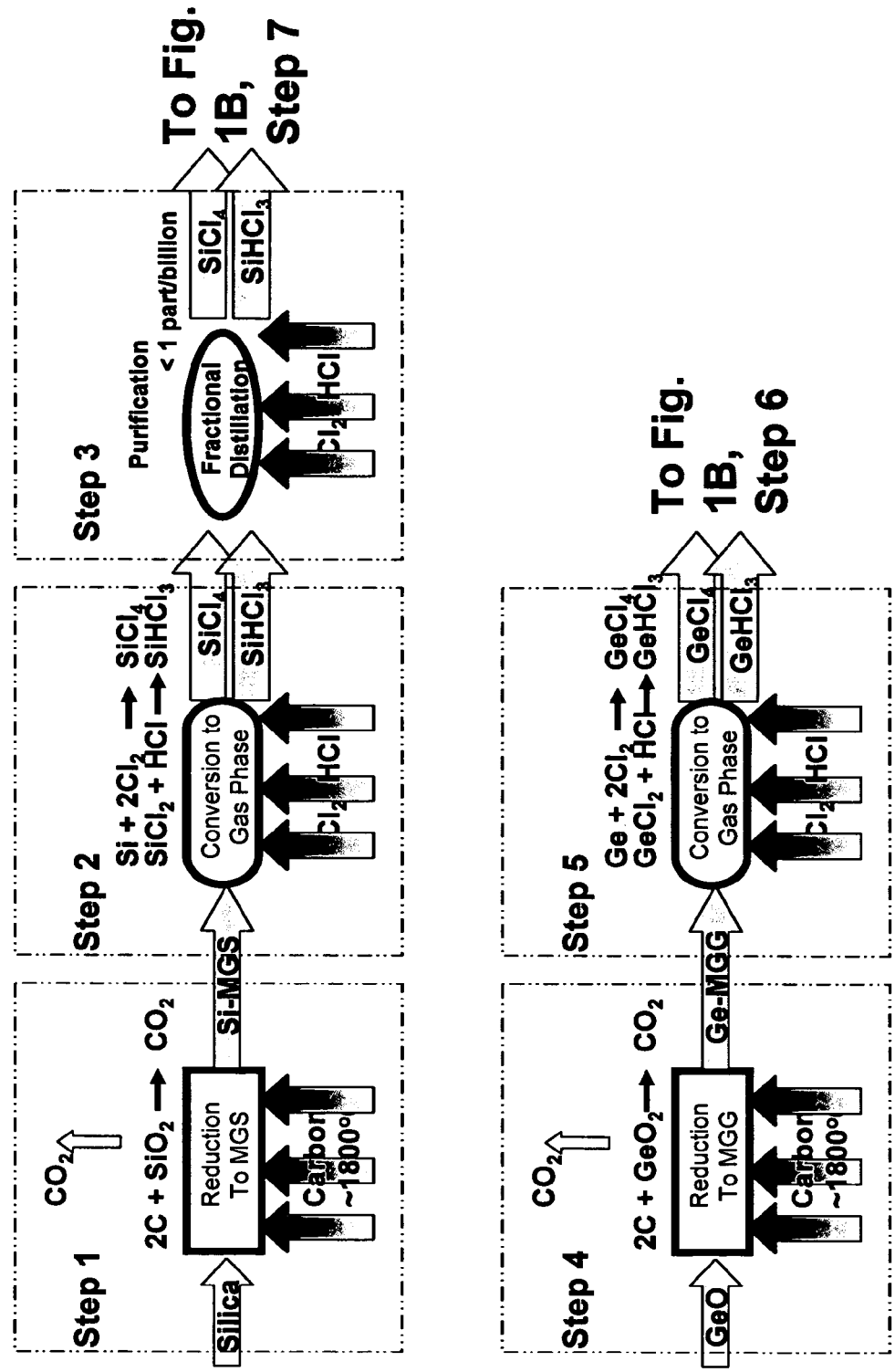
FIG. 1 is process flow schematic of conventional methods to form optical communication grade optical fibers.
Figure 1B:
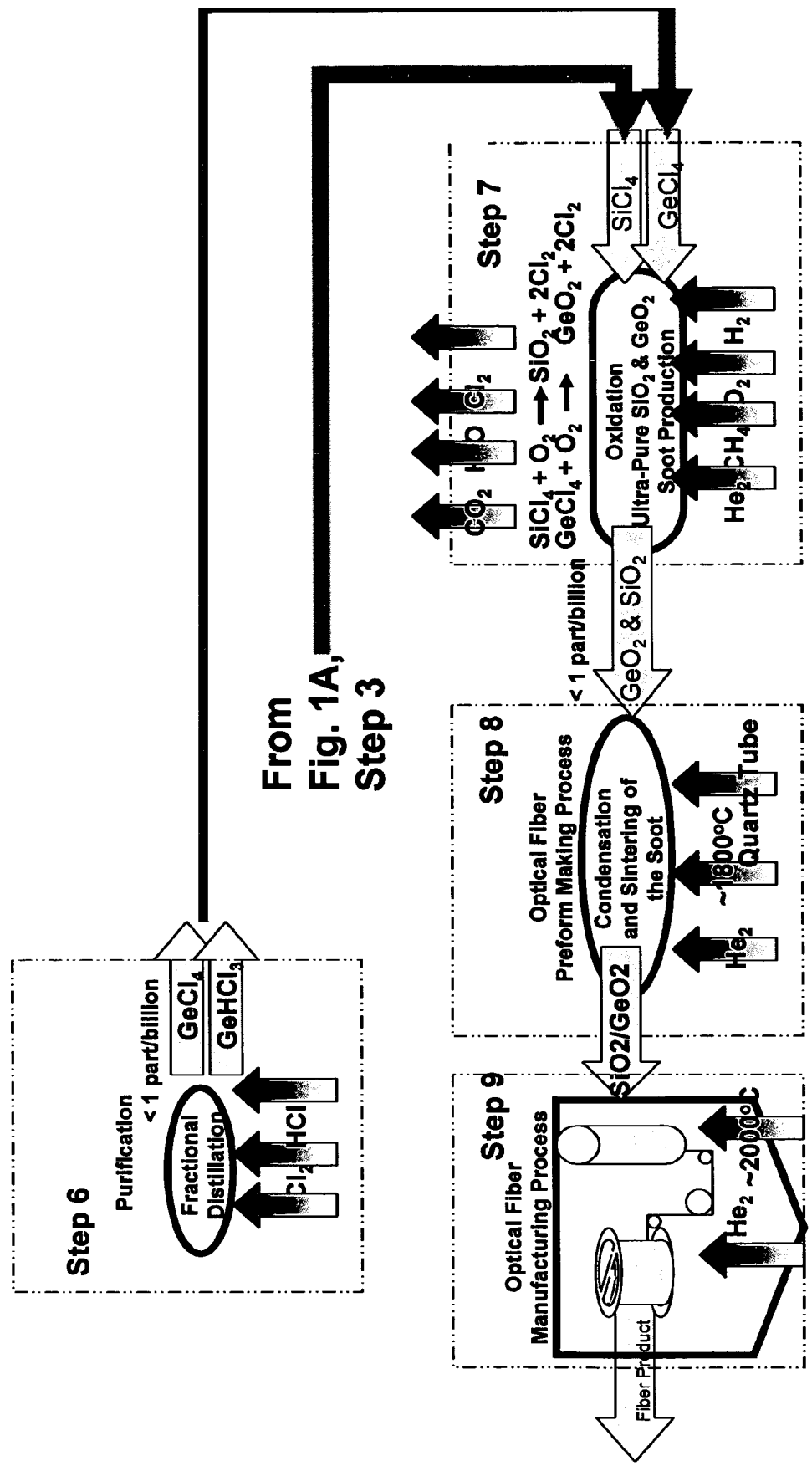

Advantageously, all of the costly 9 steps of conventional processing showing in FIG. 1 can be replaced by only two steps. Further, the present process to achieve the same result in a more environmentally friendly manner and much less costly. Not only does the two step method produce optical fibers, but it also produces the ultra-pure starting material which the key to a novel method for the production of ultra-pure crystalline silicon for the photovoltaic solar energy converters and the microelectronics industry, micro-electro-mechanical systems (MEMS) other industries that utilize silicon of ultra-high purity.

In FIG. 2, the step of forming a ribbon or sheet of silicon oxide is shown as step 1. Silica, e.g., sand, may be heated and drawn to form silicon oxide ribbon. Using conventional glass processing technology, one can draw silicon oxide, of about 97-99+% purity, into sheets or ribbons. This is accomplished, e.g., by heating silica to about 1800-2000C. In preferred embodiments of the present invention, the ribbon is drawn to a thickness of 1 to about 10 microns. The ribbons may be drawn to many different lengths and widths. This drawn silicon oxide sheet or ribbon, at 97-99+% purity, may be used in certain applications. This enhances the invention in that the system herein allows one to provide this as a product, along with the results of the subsequently described ionic sweeping purification process.

Step 2 shows schematically the ionic sweeping purification process. In general, the thin silicon oxide ribbon is subjected to temperature approaching or exceeding the melt temperatures. For example, the ribbon may be heated to about 1300 to about 2000C. An ionic driving force is applied to concentrate the now motile ionic "impurities" to one or more locations of the sheet or ribbon. An electric field may be applied, for example, with electrodes about the ribbon and suitable voltage source, a magnetic field may be applied, or other ionic driving forces and combinations. Ions are driven to a controlled area, such as the edge, a surface, both edge and surface. In this manner, for example, with silica as a starting product, silicon oxide ribbon having impurities of less than 1 part per billion may be produced. By virtue of the synergistic effect of the ionic driving forces, the fact that the substance is in the form of a very thin sheet or ribbon (thereby decreasing force required as distance required is minimized), and the semi-molten or molten state (thereby increasing ion mobility), extreme purity may be obtained.

The ribbon or sheet may be free standing, or alternatively supported. For example, the material may be supported on a roll. Further, the material can be supported on molten tin or indium, such as in traditional float glass processing. Preferably, when the sheets or ribbons are very thin, the direction of ribbon during processing can be vertical, horizontal, meandering, or whatever path that is advantageous to processing.

Figure 3:
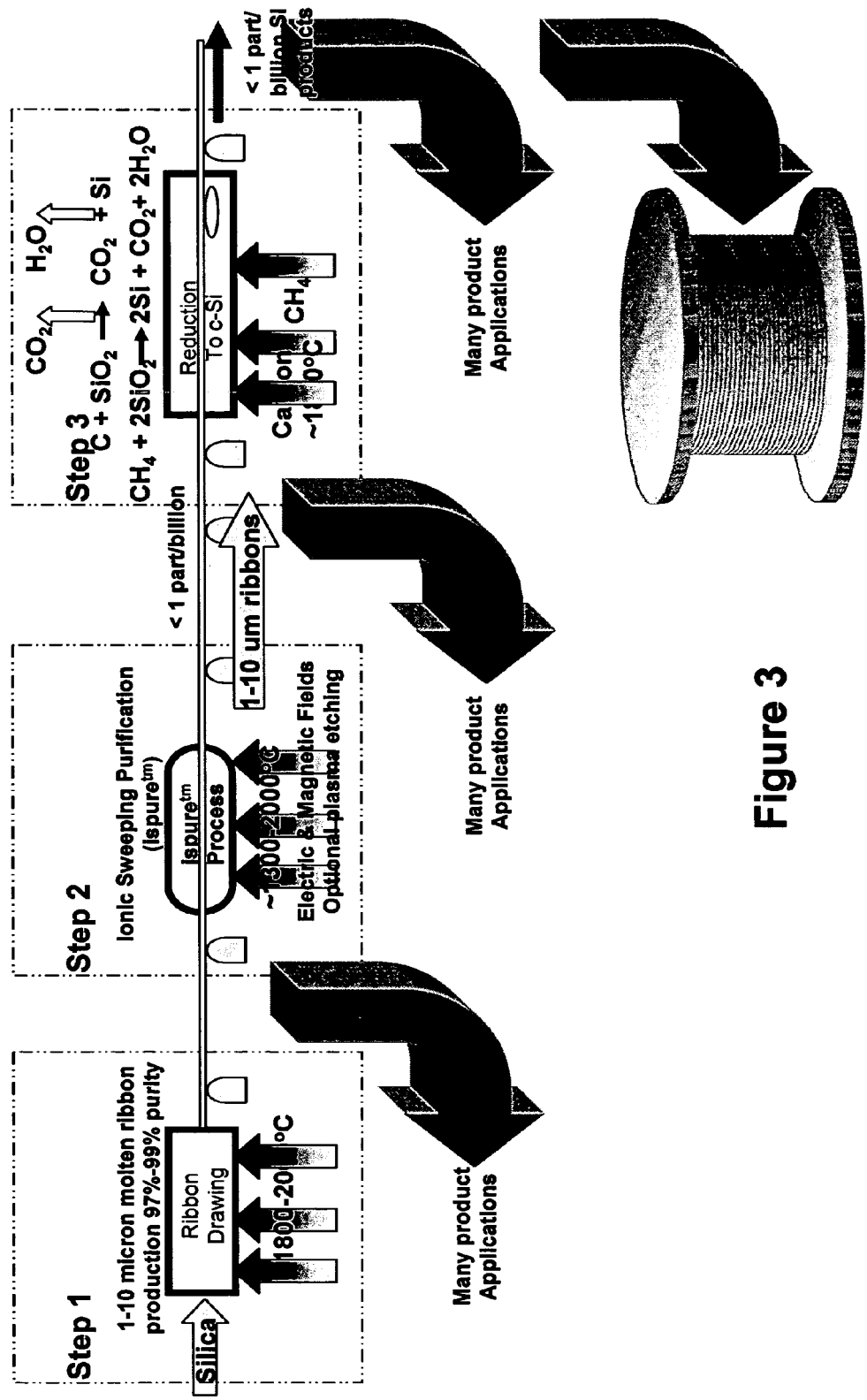
FIG. 3 is a process flow schematic for forming ultra pure silicon sheets or ribbons

FIG. 3 shows an example of a process of the present invention for forming ultra pure silicon sheets or ribbons. In this process, steps 1 and 2 may be the same as shown with regard to FIG. 2. This is advantageous in that the "under-one-roof" process allows one to deliver: impure (e.g., 97-99+%) oxide sheets or ribbons, such as $SiO_2$; ultra pure (<1 ppb) SiO2 sheets or ribbons; ultra pure Si sheets or ribbons; ultra pure Si sheets or ribbons may be produced; reduction, e.g., of oxide. The $SiO_2$ may be reduced with carbon. In addition, or in combination, the $SiO_2$ may be reduced using plasma assisted decomposition of methane. Methane may be made very pure, liquefied, and the products separated using fractional distillation.

In a preferred method of reducing the $SiO_2$, pyrolithic reduction using methane is practiced. A deposition chamber may deposit methane from one or both sides of the film. The film is reduced in a reduction chamber. The method may employ plasma assisted decomposition. Alternatively, the chamber for deposition may also be a reduction chamber. Methane in the chamber may reduce directly, as opposed to $H_2O$ or $CO_2$ which both tend to take the free oxygen.

A crystallization step also may occur within a chamber. Various techniques may be employed to crystallize the Si film, if a single crystal Si film is the desired product. In certain embodiments, the crystallization is facilitated with a seed over which the Si ribbon is passed. The seed may take various forms. For example, a single crystal seed, single crystal seed coated with porous Si, or single crystal seed coated with SiGe may be used.

In certain embodiments, the seed may be in the form of a drum, e.g., a cylindrical drum. In other embodiments, the drum may be formed as 3D polygon, e.g., 3D hexagon. For example, a hollow drum may be used so that heat can be removed from within. The drum may be coated with the seed in various forms, such as single crystal seed, single crystal seed coated with porous Si, or single crystal seed coated with SiGe.

These sheets or ribbons may advantageously be supported on rolls. Alternatively, the sheets or ribbons may be cut into shorter pieces and stacked, folded, or stored in any convenient manner depending on the desired application.

Figure 4:
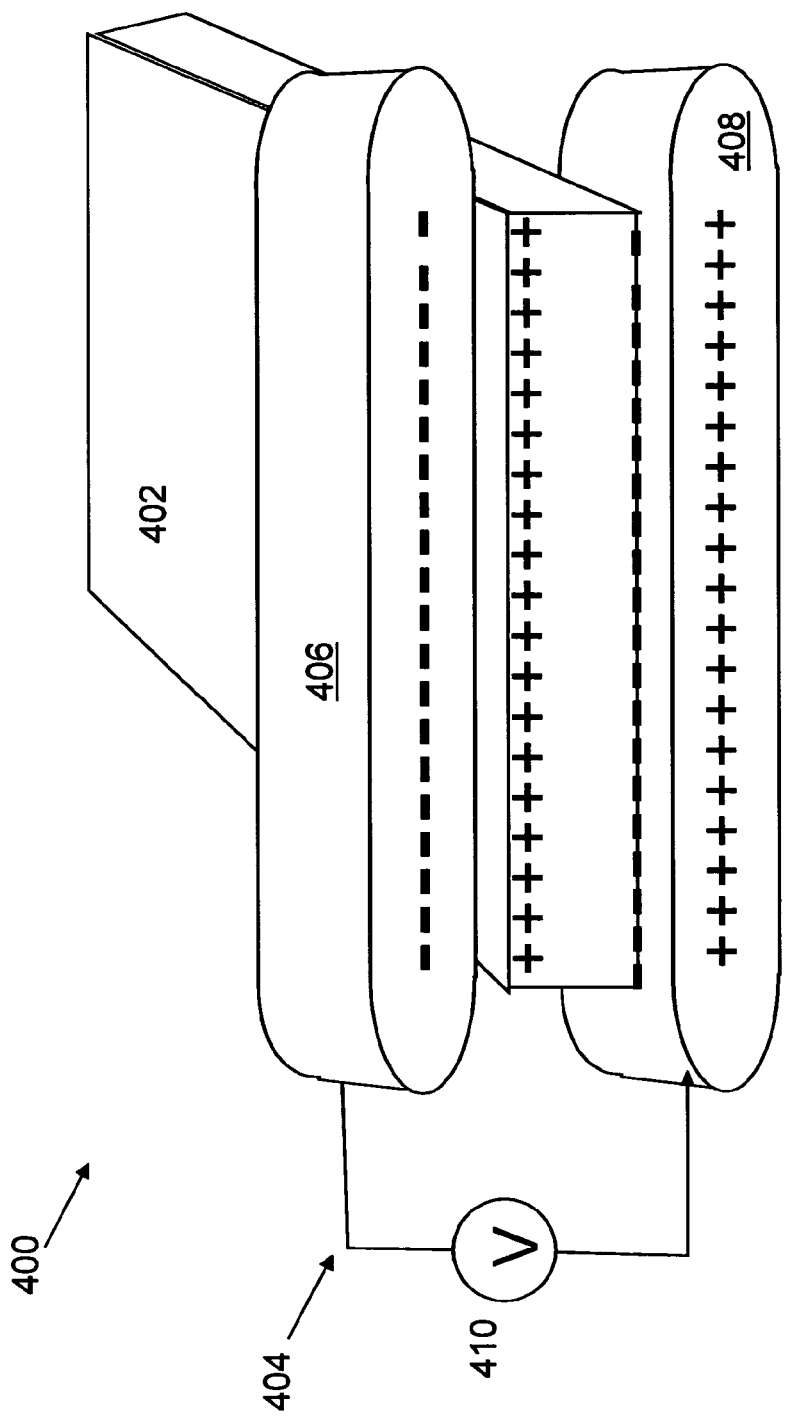
FIG. 4 shows one general example of the ionic sweeping purification process and system.

FIG. 4 shows one general example of the ionic sweeping purification process and system. A system 400 includes a ribbon 402 exposed to an ionic sweeping purification system 404. The ionic sweeping purification system 404 includes a pair of electrodes 406,408 operably connected to a voltage source 410. During operation, the ribbon 402 is exposed to an electric field between the electrodes 406, 408. Relative motion, described further herein, is created to sweep the ions to one or more surfaces or edges of the ribbon. The electrodes 406, 408 may be plate electrodes. Alternatively, electrodes 406,408 may comprise belt electrodes on suitable roller structures.

Figure 5:
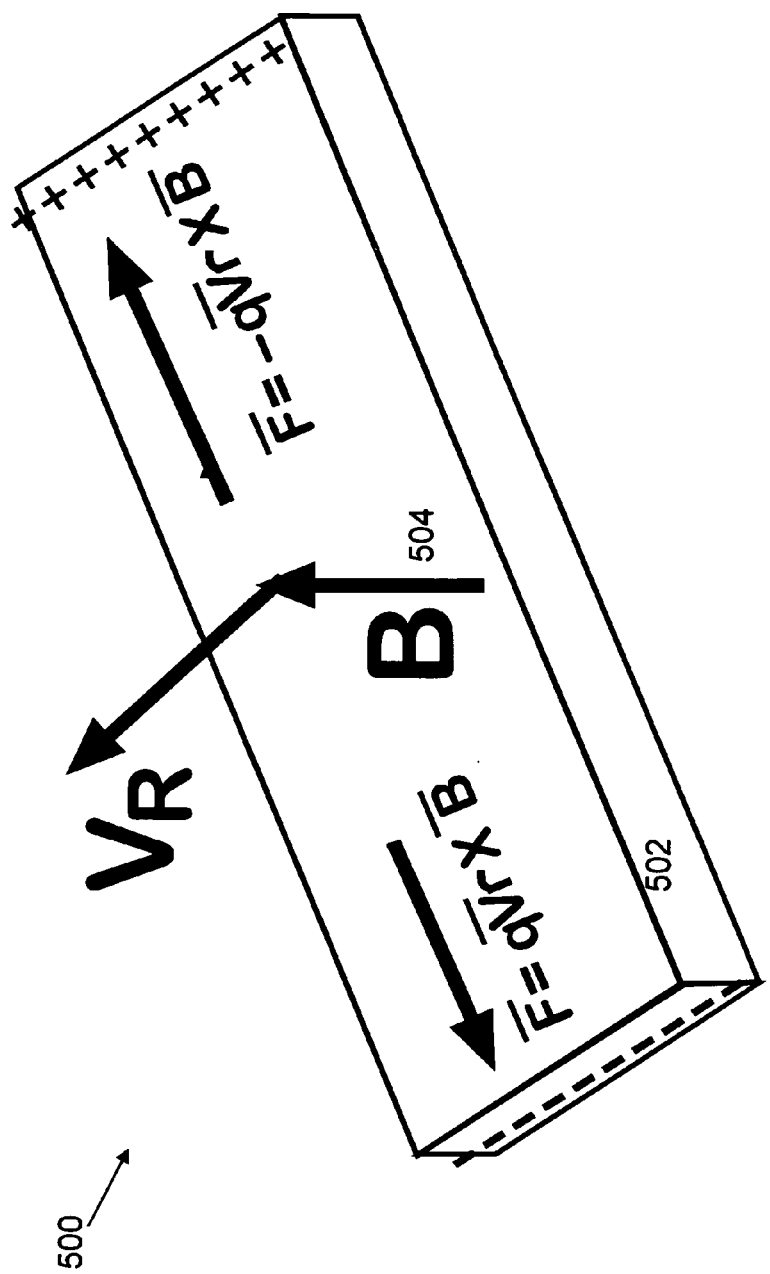
FIG. 5 shows another general example of the ionic sweeping purification process and system.

FIG. 5 shows another general example of the ionic sweeping purification system. A system 500 includes a ribbon 402 exposed to an ionic sweeping purification system 504. The ionic sweeping purification system 504 includes a magnetic field, e.g., generated by suitable magnets, electromagnets or superconducting magnets may be used during operation, the ribbon 502 is exposed to the magnetic field 504. Relative motion, shown as V(r) (ribbon velocity), is created to sweep the ions. The ions will traverse towards the edges as shown, generally due to the Lorenz forces (F=q V(r)×B). When a desired length is attained, the ribbon may be cut, whereby the swept ions at the edges may be sliced off are represented by cut lines 75 in FIG. 12.

Figure 6:
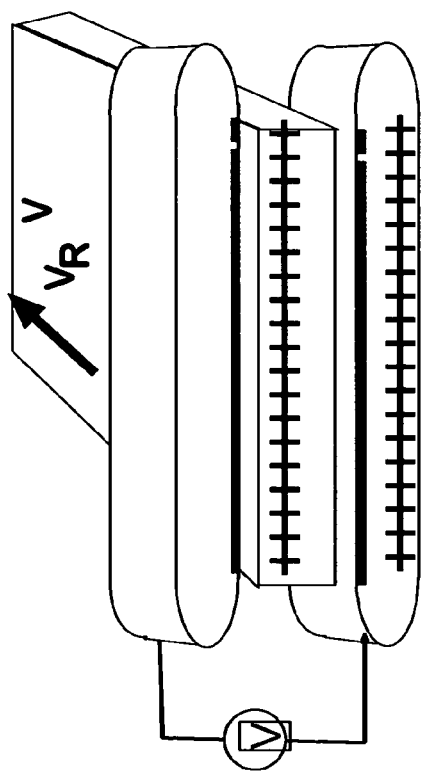
FIG. 6 shows one example of an electric field based ionic sweeping purification system of the present invention.

FIG. 6 shows one example of an electric field based ionic sweeping purification system of the present invention. As shown in FIG. 6, the ribbon is moved in a direction V(r). For example, the ribbon may be pulled, traversed along a conveyor system, traverse across a float glass system, traverse as a flowing molten or semi-molten bed, or otherwise move in the velocity vector V(r). The ions are swept generally towards one end of the ribbon. When a desired length is attained, the ribbon may be cut, whereby the swept ions at the end may be cut off, as represented by cut line 75 in FIG. 10.

Figure 7:
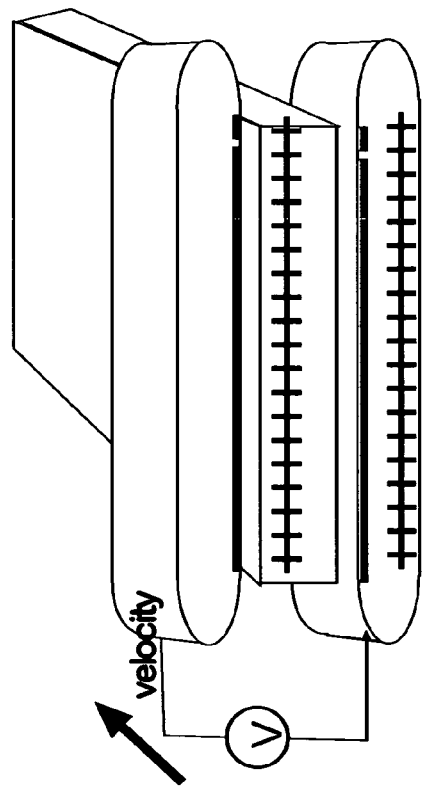
FIG. 7 shows another example of an electric field based ionic sweeping purification system of the present invention.

FIG. 7 shows another example of an electric field based ionic sweeping purification system of the present invention. As shown in FIG. 7, the ionic sweeping system is moved in a direction V(s). For example, the system may traverse on tracks, pulleys, a conveyor system, or the like. Alternatively, motorized arms or other structures may cause the ionic sweeping system to move relative the ribbon or bed of molten or semi-molten material. The ions are swept generally towards one end of the ribbon. When a desired length is attained, the ribbon may be cut, whereby the swept ions at the end may be cut off, as represented by cut line 75 in FIG. 10.

Figure 8:
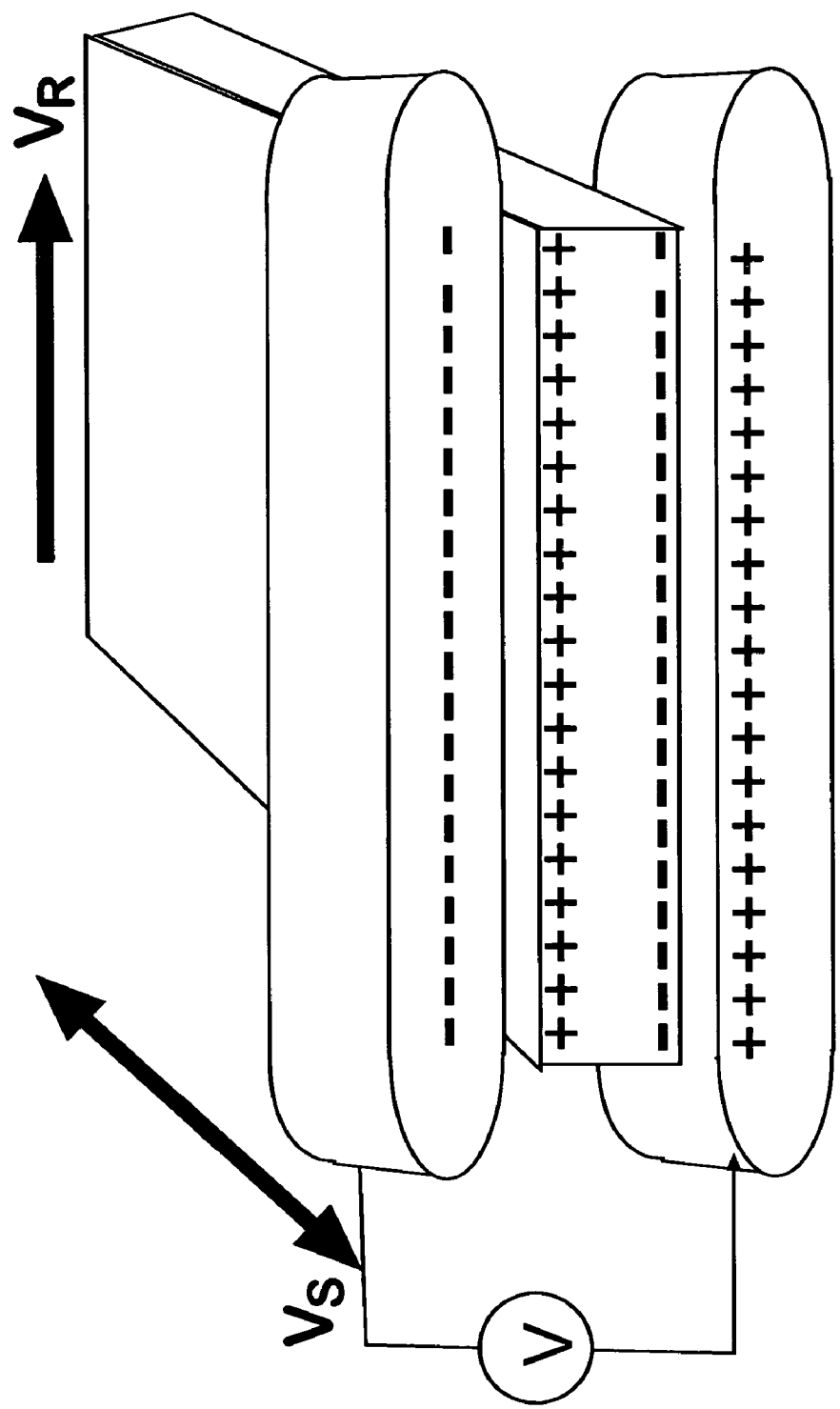
FIG. 8 shows yet another example of an electric field based ionic sweeping purification system of the present invention.

FIG. 8 shows yet another example of an electric field based ionic sweeping purification system of the present invention. As shown in FIG. 8, the ionic sweeping system is moved back and form across the ribbon, denoted V(s). Further, the ribbon moves at a velocity vector V(r). The ions are swept generally towards one edge of the ribbon. When a desired length is attained, the ribbon may be cut, whereby the swept ions at the edge may be sliced off, as represented by cut line 75 in FIG. 11.

Figure 9:
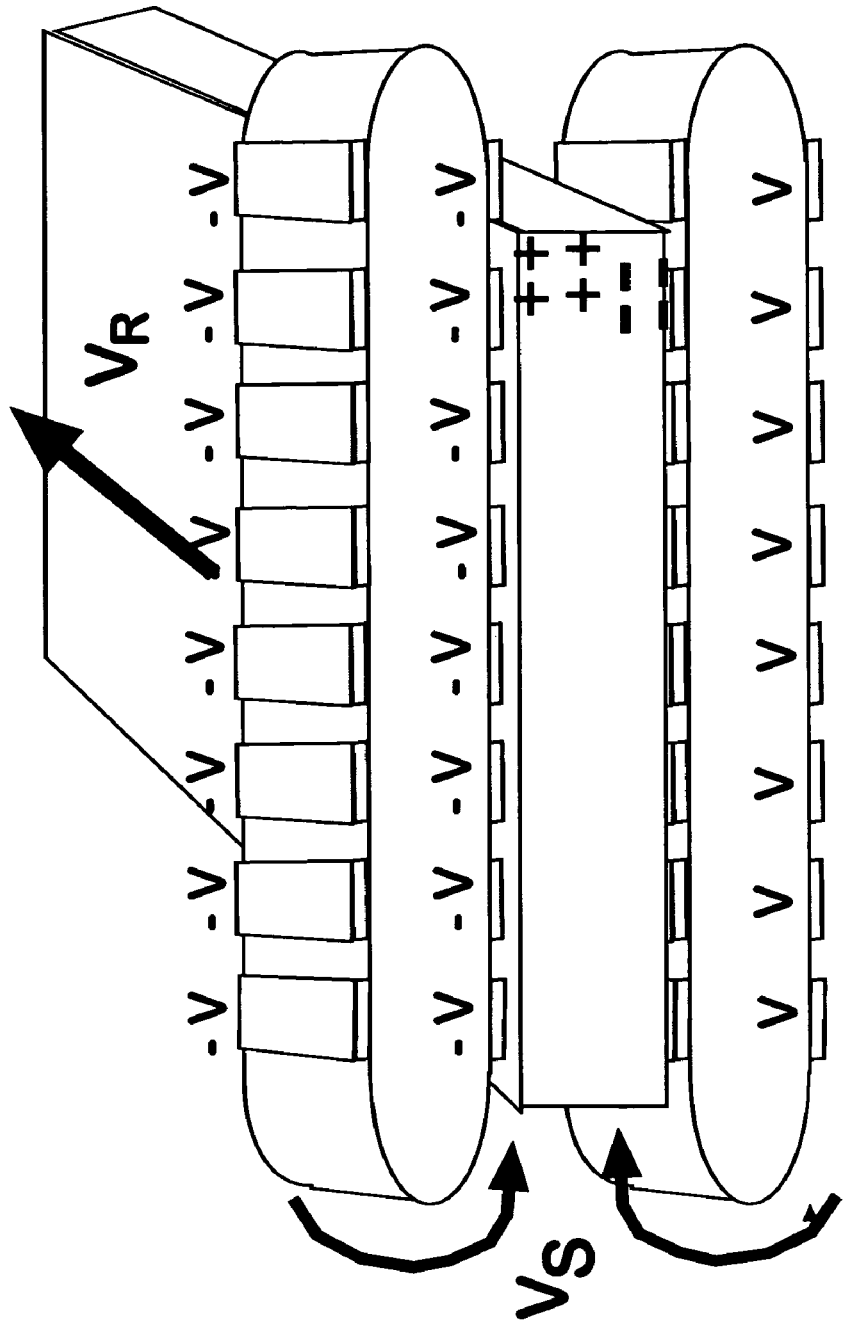
FIG. 9 shows still another example of an electric field based ionic sweeping purification system of the present invention.

FIG. 9 shows still another example of an electric field based ionic sweeping purification system of the present invention. As shown in FIG. 9, the ionic sweeping system is a rotating belt having plural electrodes. The belt moves across the ribbon, denoted V(s). Further, the ribbon moves at a velocity vector V(r). In certain embodiments, the motion V(s) of the belts is synchronized. The ions are swept generally towards one edge of the ribbon. When a desired length is attained, the ribbon may be cut, whereby the swept ions at the edge may be sliced off, as represented by cut line 75 in FIG. 11.

Figure 14:
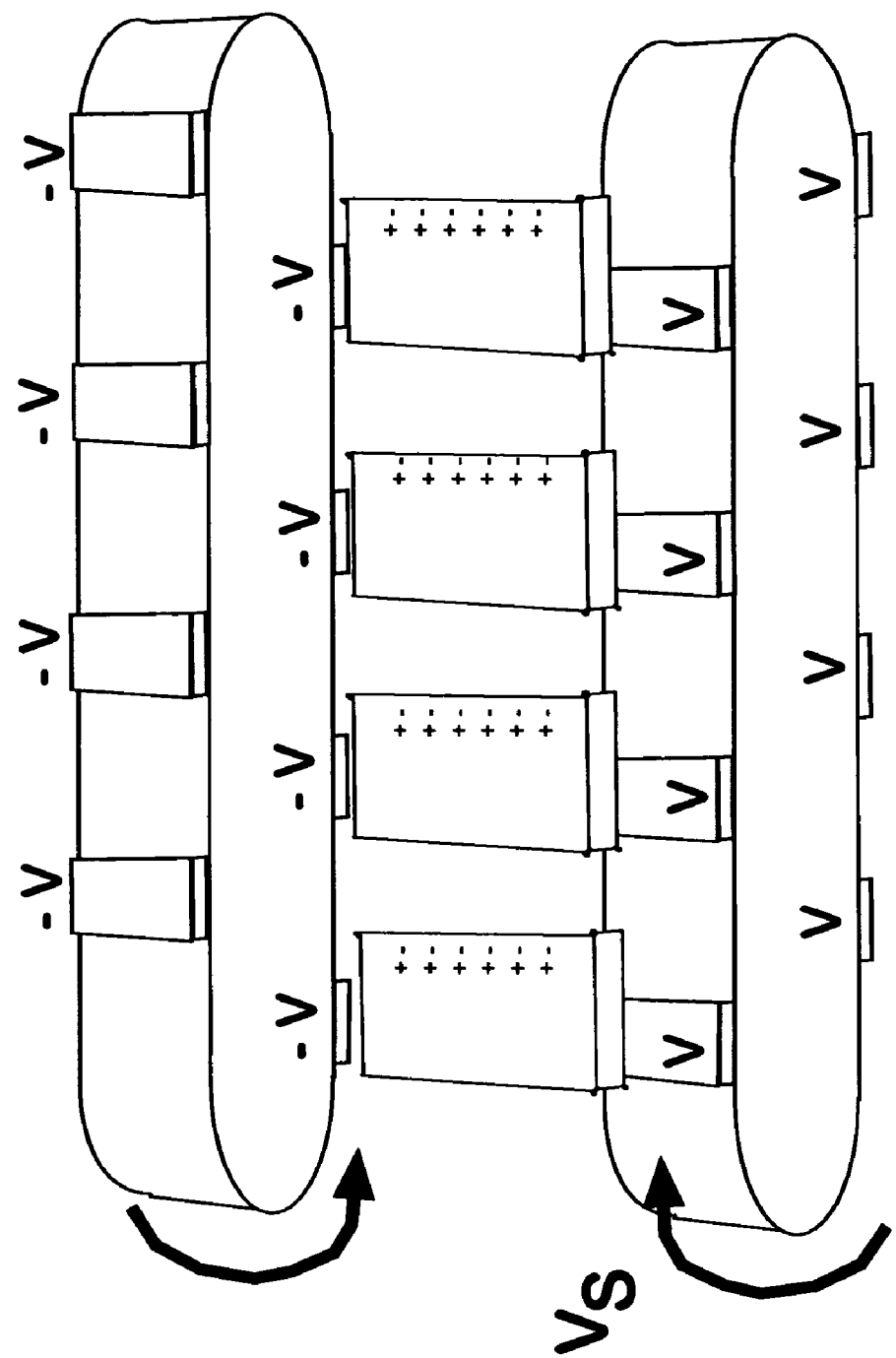
FIG. 14 shows another example of an electric field based ionic sweeping purification system of the present invention.

FIG. 14 shows still another example of an electric field based ionic sweeping purification system of the present invention. As shown in FIG. 14, the ionic sweeping system is a rotating belt having plural electrodes. The belt moves across a plurality of strips, denoted V(s). Further, the ribbon moves at a velocity vector V(r). In certain embodiments, the motion V(s) of the belts is synchronized. The ions are swept generally towards one edge of each of the strips. When a desired length of purified material is attained on the strips, the strips may be cut, whereby the swept ions at the edge may be sliced off.

The ionic sweeping processed described herein may follow various protocols. For example, the sweeping device (e.g., electrodes, sheet motion device, field generating device) may be oscillated at various frequencies. The electric and/or magnetic field application may be pulsed or constant. L In additional embodiments, other driving forced may be employed to enhance the sweeping process. For example, light assisted ion sweeping or ultrasonic assisted ion sweeping may be practiced alone as the driving force for ionic sweeping in certain embodiments, or in combination with one or more heretofore mentioned ionic sweeping driving forces including electric field and magnetic field.

In further embodiments, the ionic sweeping may integrate zone melting for enhanced flexibility. For example, zone melting purification, well known in the art of transforming polycrystalline Si into single crystalline Si, includes forming molten regions and moving the heat source along the body of the boule to "move" the melt zone. As mentioned above, regions with higher impurities will have a lower melting temperature and will be moved.

This principle may be incorporated into the herein described ionic sweeping system. For example, heat source may traverse coincidentally or in other suitable sequential manner with the ionic sweeping devices described above. Thus, the area being swept may coincide with the molten zone of the ribbon or sheet. This process may encourage both single crystal formation (due to higher viscosity of material behind molten zone, i.e., more pure material) and ion mobility in front of heater or molten zone, since the melting temperature is lower, and the temperature of the heater is constant.

The processes described herein may be repeated more than one time, for example, for increased levels of purity. Alternatively, it may be desirable to repeat the process optimized for certain types of impurities in various stages.

FIGS. 13A1-13A3 representatively show sheets of material. However, it should be appreciated that these sheets may be cut sheets, or may be a long sheet, e.g., ribbon, formed on a roll or folded. FIG. 13A1 shows that the material purified according to the present invention may be in the form of single layer sheets. FIG. 13A2 shows that the material purified according to the present invention may be in the form of laminated sheets. This may represent several homogeneous layers. Alternatively, this may represent heterogeneous layers. For example, Si may be on a substrate. Silicon on Insulator (SOI) may be formed. FIG. 13A2 shows that the material purified according to the present invention may be in the form of multi-laminated sheets, wherein 3 layers are shown. Of course, many more layers may be laminated. This may represent several homogeneous layers. Alternatively, this may represent heterogeneous layers. For example, Si or another material may be between a substrate and a super-strate. It is apparent that layers of various thicknesses may be laminated to form a desired heterogeneous or homogeneous sheet, ribbon, or free standing structure.

FIG. 13B shows the material in the form of sliced strips, e.g., sliced from wider sheets or ribbons. FIG. 13C shows the material in the form of cylindrical rods, or pre-forms, particularly useful for drawing fibers.

Figure 12:
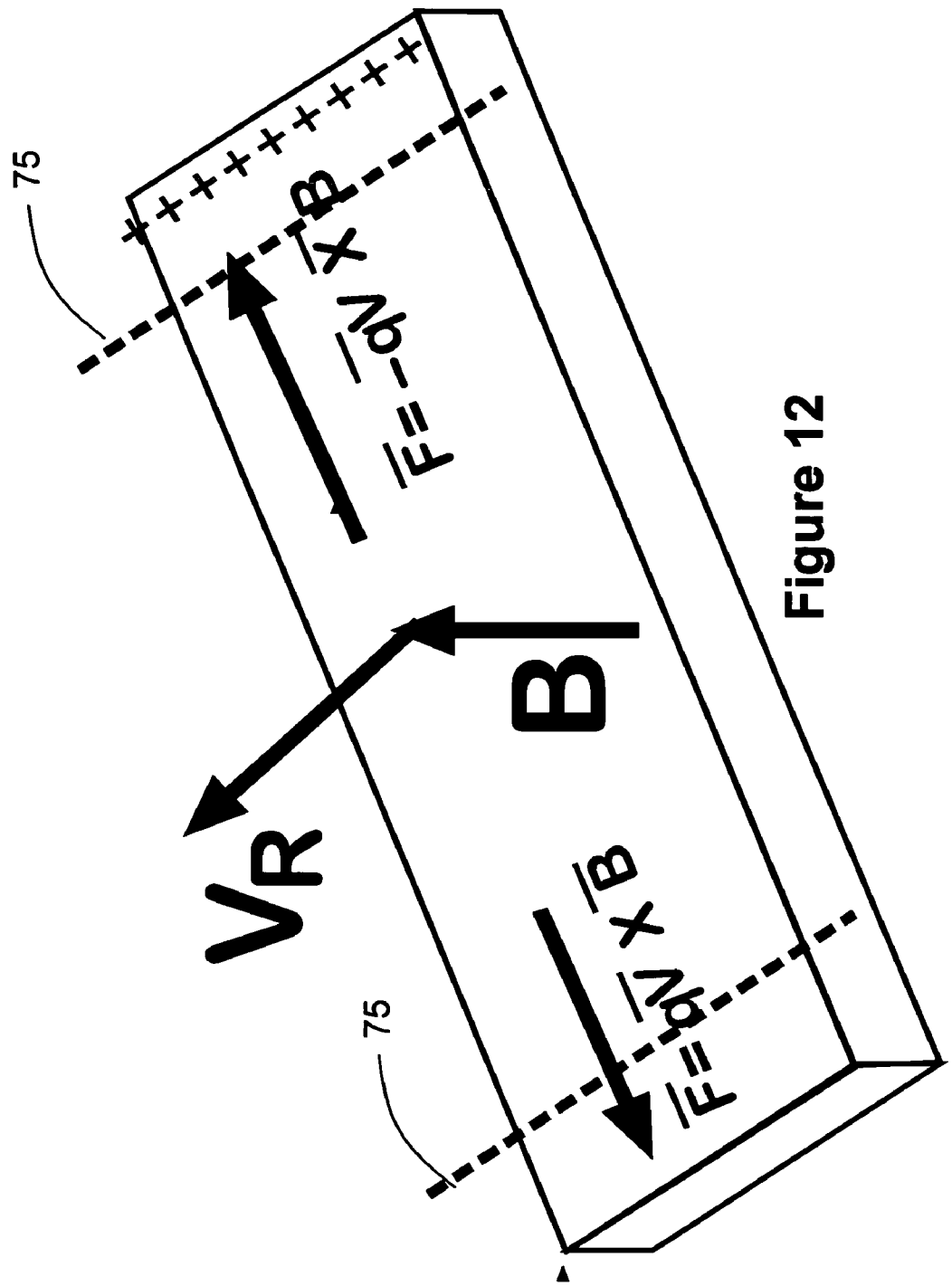

As referenced above, FIGS. 10-12 representatively show mechanically cutting away sections of the ribbon with impurities. Alternatively, in certain embodiments, chemical methods may be used to remove impurities. For example, impurities may form at larger surfaces of the ribbon (as opposed to the edge). In these embodiments, sputter etching or reactive plasma etching may be suitable to remove the thin layer of impurities form the ribbon surface.

The various processes and systems described herein are useful to form various end products or intermediate products. Fore example, the product may be in the form of rolled $SiO_2$ ribbon, sheets of $SiO_2$, rolled single crystalline Si ribbon, sheets of single crystalline Si, rolled amorphous Si ribbon, sheets of amorphous Si, rolled polycrystalline Si ribbon, sheets of polycrystalline Si, other materials rolled or formed into sheets, and fibers, such as communications grade optical fibers.

Advantageously, the present invention utilizes various properties of glass or other material to be purified. Ideal candidate materials include those that: are malleable and can be formed or drawn into various shape when heated; behave like a super cooled liquid when heated; its viscosity decreases with increasing T; ion mobility increases as melting T is approached. Further, by drawing the material into very thin sheets or ribbons, ions advantageously have short distance to move. Various metals may also be processed according to the embodiments herein to form thin ribbons with or without support.

Referring now to FIG. 15, a system and method is shown for further purifying a material purified according to the ionic sweeping system herein. A material 155 is expelled from an ionic purification system 152 as described herein. A shaving device 156 is provided, at a suitable angle relative one or both surfaces of the material 155, which contain impurities. The result is a shaved material 157, which includes a portion of a pure section of material 155, and shavings 158. Shavings 158 may be recycled.

Referring now to FIG. 16, a system and method is shown for further purifying a material purified according to the ionic sweeping system herein. A material 165 is expelled from an ionic purification system 162 as described herein. A shaving device 166 is provided, at one or both surfaces of the material 165. The result is a shaved material 167 and shavings 168. Shavings 168 may include an ultra thin oxide layer. The shaving of the layer 168 may be facilitated by reducing the melting temperature of the top surface of the material 165 relative the remainder of the material 165 so that the viscosity is lower at the top as compared to the remainder of the material 165. For example, the melting temperature may be lowered by adding various impurities as described herein. The shaving 168 may be further subject to ionic purification as provided herein to remove impurities added to reduce the melting temperature.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of purifying substances comprising
   applying heat to a sheet of a substance containing ionic impurities thereby approaching or exceeding molten temperatures and lowering the viscosity of the sheet material, whereby ionic conductivity of ionic impurities is increased; and
   ion sweeping the sheet by providing an ionic driving force and a thermal driving force,
   wherein ions are swept to a collectable region of the sheet.

2. The method as in claim 1, wherein the collectable region is at a surface of the sheet.

3. The method as in claim 2 wherein the collectable region is at a central strip on the surface of the sheet.

4. The method as in claim 2 wherein the collectable region is at a substantial portion of the surface of the sheet.

5. The method as in claim 2 wherein the collectable region is at the entire surface of the sheet.

6. The method as in claim 1, wherein the collectable region is at an edge of the sheet.

7. The method as in claim 1, wherein the collectable region is at an edge of the sheet and at a surface of the sheet.

8. The method as in claim 1, wherein the thickness of the sheet is decreased thereby increasing ionic conductivity of ionic impurities.

9. The method as in claim 1, wherein the sheet is formed into thin ribbon near or above the melting temperature of the sheet material.

10. The method as in claim 1, wherein the sheet is free standing.

11. The method as in claim 1, wherein the sheet is supported on a substrate.

12. The method as in claim 1, wherein the ion sweeping is performed with one or more electrodes moving at a velocity $V(s)$.

13. The method as in claim 1, wherein the ion sweeping is performed with the sheet moving at a velocity $V(r)$.

14. The method as in claim 1, wherein the ion sweeping is performed with one or more electrodes moving at a velocity $V(s)$ and with the sheet moving at a velocity $V(r)$.

15. The method as in claim 14, wherein the direction of $V(s)$ is substantially the same as the direction of $V(r)$.

16. The method as in claim 14, wherein the direction of $V(s)$ is substantially orthogonal to the direction of $V(r)$.

17. The method as in claim 1, wherein the ion sweeping is performed with a magnetic field.

18. The method as in claim 1, further comprising:
    removing impurities by mechanical cutting.

19. The method as in claim 1, further comprising:
    removing impurities by chemical removal.

20. The method as in claim 19, wherein chemical removal is selected from the group consisting of sputter etching and reactive plasma etching.

21. The method as in claim 1 wherein ionic sweeping includes light assisted ion sweeping.

22. The method as in claim 1 wherein ionic sweeping includes ultrasonic assisted ion sweeping.

23. The method as in claim 1, wherein ionic sweeping is performed in conjunction with zone melting.

24. The method as in claim 1, wherein ion sweeping is performed in a continuous manner.

25. The method as in claim 1, wherein ion sweeping is performed in a batch manner.

26. The method of claim 1, wherein the substance to be purified is a reducible substance.

27. The method of claim 1, wherein the substance to be purified is an organic solid.

28. The method of claim 1, wherein the substance to be purified is an inorganic solid.

29. The method of claim 1, wherein the substance to be purified is a nitride, sulfide, oxide, chloride, or carbide.

30. The method of claim. 1, wherein the substance to be purified is a metal or alloy.

31. The method of claim 1, further comprising shaving of impurities at a top and/or bottom surface of the sheet.

32. The method of claim 1, further comprising shaving an ultra thin layer at a top and/or bottom surface of the sheet.

33. The method of claim 32, further comprising ion sweeping the ultra thin layer by providing an ionic driving force and a thermal driving force.

34. A method of purifying substances comprising
    providing a sheet of a substance containing ionic impurities;
    decreasing a thickness of the sheet thereby increasing ionic conductivity of ionic impurities;
    ion sweeping the sheet by providing an ionic driving force and a thermal driving force,
    wherein ions are swept to a collectable region of the sheet.

35. The method as in claim 34, wherein heat is applied to the sheet thereby increasing ionic conductivity of ionic impurities.

36. The method as in claim 34, wherein heat is applied to the sheet thereby approaching or exceeding molten temperatures and lowering the viscosity of the sheet material, whereby ionic conductivity of ionic impurities is increased.

37. The method as in claim 34, wherein the sheet is formed into thin ribbon near or above the melting temperature of the sheet material.

38. The method as in claim 34, wherein the sheet is free standing.

39. The method as in claim 34, wherein the ion sweeping is performed with one or more electrodes moving at a velocity $V(s)$.

40. The method as in claim 34, wherein the ion sweeping is performed with the sheet moving at a velocity $V(r)$.

41. The method as in claim 34, further comprising:
    removing impurities by mechanical cutting.

42. The method as in claim 34, further comprising:
    removing impurities by chemical removal.

43. The method as in claim 42, wherein chemical removal is selected from the group consisting of sputter etching and reactive plasma etching.

44. The method as in claim 34 wherein ionic sweeping includes light assisted ion sweeping.

45. The method as in claim 34, wherein ionic sweeping includes ultrasonic assisted ion sweeping.

46. The method as in claim 34, wherein ionic sweeping is performed in conjunction with zone melting.

47. The method of claim 34, wherein the substance to be purified is selected from the group consisting of reducible substances, organic solids, inorganic solids, nitrides, sulfides, oxides, chlorides, carbides, metals, and alloys.

48. The method of claim 34, further comprising shaving off impurities at a top and/or bottom surface of the sheet.

49. A method of purifying substances comprising
ion sweeping a sheet of a substance containing ionic impurities by providing an ionic driving force and a thermal driving force, wherein ion sweeping includes one or more of light assisted ion sweeping and ultrasonic assisted ion sweeping,
wherein ions are swept to a collectable region of the sheet.

50. The method as claim 49, wherein heat is applied to the sheet thereby increasing ionic conductivity of ionic impurities.

51. The method as in claim 49, wherein heat is applied to the sheet thereby approaching or exceeding molten temperatures and lowering the viscosity of the sheet material, whereby ionic conductivity of ionic impurities is increased.

52. The method as in claim 49, wherein the thickness of the sheet is decreased thereby increasing ionic conductivity of ionic impurities.

53. The method as in claim 49, wherein the sheet is formed into thin ribbon near or above the melting temperature of the sheet material.

54. The method as in claim 49, wherein the sheet is free standing.

55. The method as in claim 49, wherein the ion sweeping is performed with one or more electrodes moving at a velocity V(s).

56. The method as in claim 49, wherein the ion sweeping is performed with the sheet moving at a velocity V(r).

57. The method as in claim 49, further comprising:
removing impurities by mechanical cutting.

58. The method as in claim 49, further comprising:
removing impurities by chemical removal.

59. The method as in claim 58, wherein chemical removal is selected from the group consisting of sputter etching and reactive plasma etching.

60. The method as in claim 49, wherein ionic sweeping is performed in conjunction with zone melting.

61. The method of claim 49, wherein the substance to be purified is selected from the group consisting of reducible substances, organic solids, inorganic solid, nitrides, sulfides, oxides, chlorides, carbides, metals, and alloys.

62. The method of claim 49, further comprising shaving off impurities at a top and/or bottom surface of the sheet.

63. A method of purifying substances comprising
ion sweeping and zone melting a sheet of a substance containing ionic impurities by providing an ionic driving force and a thermal driving force,
wherein ions are swept to a collectable region of the sheet.

64. The method as in claim 63, wherein heat is applied to the sheet thereby increasing ionic conductivity of ionic impurities.

65. The method as in claim 63, wherein heat is applied to the sheet thereby approaching or exceeding molten temperatures and lowering the viscosity of the sheet material, whereby ionic conductivity of ionic impurities is increased.

66. The method as in claim 63, wherein the thickness of the sheet is decreased thereby increasing ionic conductivity of ionic impurities.

67. The method as in claim 63, wherein the sheet is formed into thin ribbon near or above the melting temperature of the sheet material.

68. The method as in claim 63, wherein the sheet is free standing.

69. The method as in claim 63, wherein the ion sweeping is performed with one or more electrodes moving at a velocity V(s).

70. The method as in claim 63, wherein the ion sweeping is performed with the sheet moving at a velocity V(r).

71. The method as in claim 63, further comprising:
removing impurities by mechanical cutting.

72. The method as in claim 63, further comprising:
removing impurities by chemical removal.

73. The method as in claim 72, wherein chemical removal is selected from the group consisting of sputter etching and reactive plasma etching.

74. The method as in claim 63 wherein ionic sweeping includes light assisted ion sweeping.

75. The method as in claim 63 wherein ionic sweeping includes ultrasonic assisted ion sweeping.

76. The method of claim 63, wherein the substance to be purified is selected from the group consisting of reducible substances, organic solids, inorganic solids, nitrides, sulfides, oxides, chlorides, carbides, metals, and alloys.

77. The method of claim 63, further comprising shaving off impurities at a top and/or bottom surface of the sheet.

* * * * *